(12) United States Patent
Krohto et al.

(10) Patent No.: US 7,446,265 B2
(45) Date of Patent: Nov. 4, 2008

(54) BOARD LEVEL SHIELDING MODULE

(75) Inventors: Eric G. Krohto, Merrimac, MA (US); Lawrence J. Denefrio, Windham, NH (US); Peter Jones, Lutz, FL (US); John C. Ariel, Nashua, NH (US); Matthew T. Gagnon, Topsfield, MA (US); Douglas Nobbs, Dover, NH (US); George R. Watchko, Stoneham, MA (US); Marc E. LaRosse, Winthrop, MA (US)

(73) Assignee: Parker Hannifin Corporation, Cleveland, OH (US)

( * ) Notice: Subject to any disclaimer, the term of this patent is extended or adjusted under 35 U.S.C. 154(b) by 166 days.

(21) Appl. No.: 11/404,704

(22) Filed: Apr. 14, 2006

(65) Prior Publication Data

US 2006/0260839 A1    Nov. 23, 2006

Related U.S. Application Data

(60) Provisional application No. 60/671,802, filed on Apr. 15, 2005.

(51) Int. Cl.
*H05K 9/00* (2006.01)
*H02B 1/015* (2006.01)
*H01T 13/08* (2006.01)

(52) U.S. Cl. ........................ 174/377; 174/369; 174/370; 361/816

(58) Field of Classification Search ................. 174/350, 174/377, 369, 370; 361/816, 818
See application file for complete search history.

(56) References Cited

U.S. PATENT DOCUMENTS

| 4,739,453 | A | 4/1988 | Kurokawa | |
|---|---|---|---|---|
| 5,717,577 | A | 2/1998 | Mendolia et al. | |
| 5,763,824 | A | 6/1998 | King et al. | |
| 6,016,083 | A | 1/2000 | Satoh | |
| 6,822,161 | B2 * | 11/2004 | Komatsu et al. | 174/367 |
| 7,089,646 | B2 * | 8/2006 | Leerkamp et al. | 29/592.1 |
| 7,202,422 | B2 * | 4/2007 | Ogatsu | 174/373 |
| 7,358,447 | B2 * | 4/2008 | Gabower | 174/378 |
| 2006/0012969 | A1 * | 1/2006 | Bachman | 361/816 |

* cited by examiner

*Primary Examiner*—Hung V Ngo
(74) *Attorney, Agent, or Firm*—Rissman, Jobse Hendricks & Oliverio LLP (57) ABSTRACT

An apparatus for providing board level shielding of Electromagnetic Interference in a printed circuit board is disclosed. The apparatus includes a plastic part, a metal conformal coating and a form-in-place Electromagnetic Interference gasket. The plastic part is configured in one or more compartments to provide an enclosure, and is attached to the printed circuit board. The metal conformal coating is applied continuously to one or more surfaces of the plastic part. The form-in-place Electromagnetic Interference gasket is applied on top of the metal conformal coating in an area of a part flange.

31 Claims, 4 Drawing Sheets

BOARD LEVEL SHIELDING MODULE

CROSS-REFERENCE TO RELATED APPLICATIONS

This application claims the benefit of priority from U.S. Provisional Application No. 60/671,802 filed on Apr. 15, 2005, the specification of which is incorporated herein by reference.

BACKGROUND OF THE INVENTION

The present invention relates to electromagnetic interference (EMI) shielding, and more specifically, to board level shielding of electromagnetic interference (EMI) generated through various components mounted on a printed circuit board (PCB).

An electromagnetic signal is propagated with an electrical field component and a magnetic field component. The electromagnetic signal causes circuit components to radiate a portion of the spectral energy of the propagating signal, resulting in electromagnetic interference. Electromagnetic interference is the generation of undesired electrical signals in electronic system circuitry because of the unintentional coupling of impinging electromagnetic field energy.

Enormous progress in nanotechnology has made an electronic system smaller and has increased the density of electrical components within an instrument. In highly compact electronic systems, the dimension of the average circuit element is decreasing which in turn favors the radiation of higher frequency signals. The increasing operating frequency in these electrical systems results in an elevated level of high frequency electromagnetic interference (EMI). The prevalence of high frequency systems and portable electronic circuitries are creating a very complex spectral environment for the operation of sensitive electrical/electronic systems. Accordingly, it is often advantageous to shield an electrical/electronic component to prevent it from emitting EMI, or to shield an electrical/electronic component from EMI emitted elsewhere.

The electromagnetic interference shielding of electronic component assemblies has taken many forms. Sensitive or radiating devices may be covered with a lid and/or an enclosure which is connected to ground potential in the process of securing the cover in place. Shielding close to the source, where the field intensity is the highest, requires greater shield efficiency to contain the field.

It is common to shield the sensitive, electromagnetic interference receiving component or even the entire circuit board. Polymer thick film conductor materials, such as a screen-printable copper filled epoxy paste, are generally used to form a shield.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and typically is configured as an electrically conductive and grounded housing which encloses the device, or as a "can" which covers a discrete component or components of the device. The housing or can may be formed of a metal such as steel, aluminum, or magnesium, or alternatively, of a plastic or other polymeric material which is filled to form and electrically-conductive material, or which may be provided with a conductive coating generally applied across the interior surfaces of the housing.

The coating may be an electrically-conductive paint, a conductively-filled, molded elastomeric layer, a metal foil laminate or transfer, or a flame-sprayed or other deposited metal layer. A conductive gasket may be used to provide electrical continuity between the coating-layers applied to the various mating housing parts.

Various enclosed systems are known to a person of ordinary skill in the art. The enclosed systems are powered by external alternating current and are shielded from electromagnetic interference by the incorporation of internal shields which are connected to a ground potential. A metal cabinet housing which encloses the system may be designed to function as a shield. However, metal housings are often expensive, heavy, and difficult to make in complex shapes. The inside of a molded plastic housing may be coated with a thin metal film through vacuum metallization, but this process often yields a brittle less flexible shield. Another method is to coat the enclosure with a thin film of a conductor using a metal-filled paint. A metal-filled plastic may also be used to form the housing.

U.S. Pat. No. 4,739,453, issued to Kurokawa, discloses a shielding apparatus for shielding electric circuitry mounted on a printed circuit board against interfering electric waves. The shielding apparatus comprises a multi-layer printed circuit board having a circuit-trace printed on it. A circuitry block is mounted on the multi-layer printed circuit board and is electrically connected to the circuit-trace so that the circuitry block is connected to one other circuitry block mounted on the printed circuit board via the circuit-trace. A metallic plate is provided in order to cover and isolate one circuitry block from the other circuitry block.

U.S. Pat. No. 5,717,577, issued to Mendolia et al., discloses an apparatus for shielding electromagnetic emissions created by electronic components and circuitry. The apparatus comprises a printed circuit board on which the electronic components are mounted, a conductive gasket, and a metal shield can for shielding electronic components. The printed circuit board includes a ground plane and a ground pad ring located on a top surface of the printed circuit board surrounding the electronic components. The conductive gasket is positioned between the shield can and the ground pad ring to provide a conductive seal and to attenuate electromagnetic emissions within the shield can.

U.S. Pat. No. 5,763,824, issued to King et al., discloses a shielding cover in combination with an electrical assembly. The electrical assembly has an electrical ground, an electronic component electrically connected to the assembly, and a conductive frame which is disposed about the electronic component. The conductive frame has a mounting surface and is electrically connected to the ground. The shielding cover comprises a lid and an electrically conductive adhesive disposed between the conductive frame and the lid.

U.S. Pat. No. 6,016,083, issued to Satoh, discloses an electronic circuit apparatus for suppressing electromagnetic radiation. The apparatus comprises an electronic circuit mounted on a top surface of a printed-circuit board, an input-output terminal mounted on the printed-circuit board and a shield-case for suppressing electromagnetic radiation from the electronic circuit. The described apparatus is further provided with a conductor structure, positioned between the electronic circuit and the input-output terminal, connecting a first ground-pattern attached to a bottom surface of the printed-circuit with the shield-case.

The existing shield assemblies provide limited reuse capabilities and are limited to single compartments. The materials such as paint or plated injection molds or thermoformed materials have not deployed successfully deployed due to low shielding capabilities. A form-in place gasket has been tried in the existing assemblies, but not in conjunction with a thermally sprayed coating and an electrically conductive plastic.

It is desirable to provide shielding to small board level components in order to reduce emissions and to protect against electromagnetic interference. Preferably, the board level shield is attached to a printed circuit board (PCB) by using a mechanical means, and is rigid enough to protect printed circuit board (PCB) components. The disclosed board shield can provide the desired shielding effects as per the specifications for proper operation for the circuitries.

Therefore, there is a need for a board level shielding device which can be easily installed and available in flexible shapes for adjusting in multiple cavities. The device should be capable of being easily attached to the circuit to provide effective shielding. The present invention also provides high quality, low-cost applications shield assemblies for thermal management and EMI/RFI shielding.

Accordingly, it is an object of the present invention to provide an apparatus for board level shielding of electromagnetic interference (EMI) generated in electronic circuitry.

It is another object of the present invention to provide a method for assembling an apparatus for board level shielding of electromagnetic interference (EMI).

SUMMARY OF THE INVENTION

To address the foregoing and other deficiencies of the prior art, the present invention provides a board level shielding apparatus. In an embodiment of the present invention, a shielding apparatus providing electromagnetic interference (EMI) shielding is described. The shielding apparatus includes a plastic part, a metal coating and a form-in-place EMI gasket. The plastic part is configured as one or more compartments to provide an enclosure and is directly attached to the printed circuit board (PCB). The metal conformal coating is applied continuously and uniformly to multiple surfaces of the plastic part. The form-in-place electromagnetic interference EMI gasket is applied on top of the metal conformal coating in an area of a part flange.

In accordance with another embodiment of the present invention, a method of assembling a shielding apparatus providing electromagnetic interference (EMI) shielding is disclosed. The method includes configuring a plastic part to provide an enclosure. The plastic part can have one or more compartments. The method further includes applying a continuous metal conformal coating to one or more surfaces of the plastic part. The method further includes positioning a form-in-place Electromagnetic Interference (EMI) gasket on top of the metal conformal coating in an area of a part flange.

BRIEF DESCRIPTION OF THE DRAWINGS

The present invention is illustrated by way of examples and is not limited by the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to provide an improved understanding of the embodiments of the present invention.

DETAILED DESCRIPTION OF THE INVENTION

The present invention provides an apparatus for shielding electromagnetic interference in a printed circuit board and a method of assembling the same. More particularly, the present invention discloses an apparatus used as a board level shielding can for a printed circuit board. The shielding apparatus comprises a plastic part having one or more compartments which provides an enclosure for the circuit components mounted in the printed circuit board. The plastic part is coated with the continuous metal conformal coating. Finally, a form-in-place elastomeric gasket, applied on top of the metal conformal coating, together constitutes the configuration of the shielding apparatus.

The plastic part of the apparatus can be attached to the printed circuit board directly using mechanical methods including, but not limited to, screws, clips, heat pins, and sonic welded pins.

The plastic part is made of a thermoplastic polymer including, but not limited to, PC/ABS alloys, PST, nylon, PC, and ABS. The polymer may be made electrically conductive to increase the shielding effectiveness by the dispersion of an electrically conductive filler or powder within the polymer matrix. The electrically conductive filler includes, but is not limited to, nickel plated carbon fiber, carbon fiber, carbon powder, silver powder, copper powder, Ag/Cu powder, Ag/Al powder, Ag plated glass spheres, and nickel powder. The electrically conductive filler can be added in an amount of between about 1% and 50% by weight.

The plastic part is coated with a continuous metal conformal coating to a film thickness of from about 0.0001 inches to about 0.005 inches. Various methods are known for applying film applications including, but not limited to, thermal spraying, vacuum deposition, electro-less plating or electroplating techniques. The film composition includes, but is not limited to, the following metals, Sn, Ag, Ni, Cu, or any combination thereof.

The form-in-place gasket, applied on top of the metal coating, can be made of an elastomeric polymer. The elastomeric polymer is further dispersed with as electrical conductive filler. Examples of suitable elastomeric polymers include, but are not limited to, silicone, urethane, and flexible epoxy. The electrically conductive filler includes, but is not limited to, nickel plated carbon fiber, carbon fiber, carbon powder, silver powder, copper powder, Ag/Cu powder, Ag/Al powder, Ag plated glass spheres, nickel powder, or any combination of these fillers. The form-in-place elastomeric gasket may be provided with a cross sectional shape including, but not limited to, a "D" shape, an "0" shape, a triangular shape, a stacked "0" shape, and an "L" shape.

The present invention can now be described with reference to the accompanying drawings. The drawings are being used to illustrate the inventive concept, and do not limit the invention to the particular embodiments illustrated therein.

Figure 1:
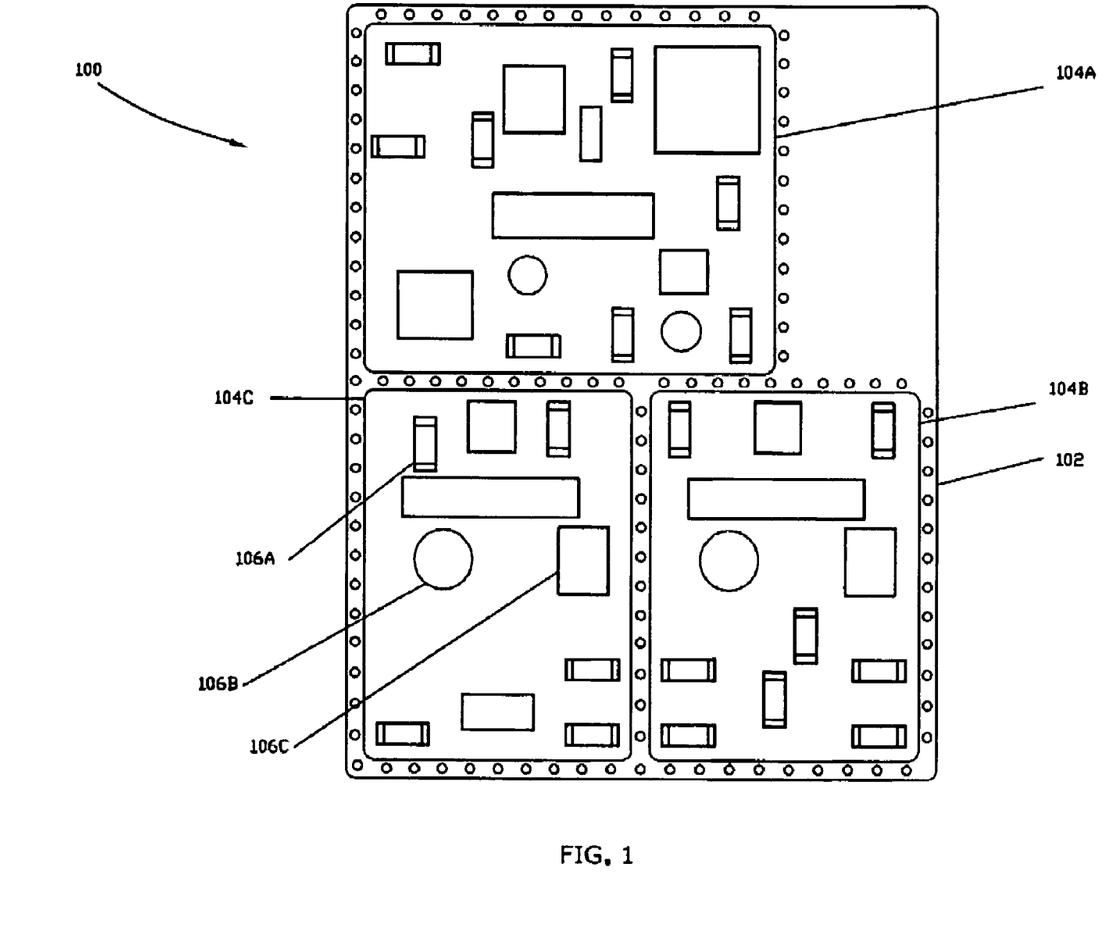
FIG. 1 represents an environment showing a printed circuit board with a shielding apparatus attached thereto, in accordance with an exemplary embodiment of the present invention.

FIG. 1 illustrates an environment 100 showing a printed circuit board 102 onto which shielding apparatus, 104A, 104B, and 104C, are attached. The shielding apparatus cover selected portions of the printed circuit board 102, in accordance with an exemplary embodiment of the present invention.

The shielding apparatus 104 provides electromagnetic interference shielding in the printed circuit board 102. The shielding apparatus 104 can be applied to desired regions or portions of the printed circuit board 102. Such regions or portions include a region of the printed wiring board 102 as well as all or part of certain components 106A, 106B, and 106C. During operation, the printed circuit board 102 may experience various electrical or electromagnetic effects such as thermal losses, Electromagnetic Interference (EMI), Radio frequency Interference (RFI), etc. The shielding apparatus 104 can prevent substantially all electromagnetic emission generated by the shielded components from emanating beyond the conformal coating.

The shielding apparatus 104 is applied to cover the surface of the printed circuit board 102. Preferably, the shielding apparatus 104 adheres to and conforms to the surface of the circuit components of the printed circuit board 102.

The printed circuit board 102 described in the present invention can be of a cellular phone circuit or any other high application circuitry. Examples of the printed circuit board 102 include, but are not limited to, cellular circuitries, advanced medical circuitries, and multiple wave-guide structures.

In addition, the application of the shielding apparatus 104 shown in the above mentioned embodiments is not limited to only the printed circuit board 102. That is, for example, the shielding apparatus 104 is also applicable to the electronic devices (such as LSI, ICs, MCMs and the like) to be mounted on the circuit board and the modules. Such devices and the modules are mounted on the printed circuit board 102 of the present invention, whereby it is further possible to enhance the shielding effects.

Figure 2:
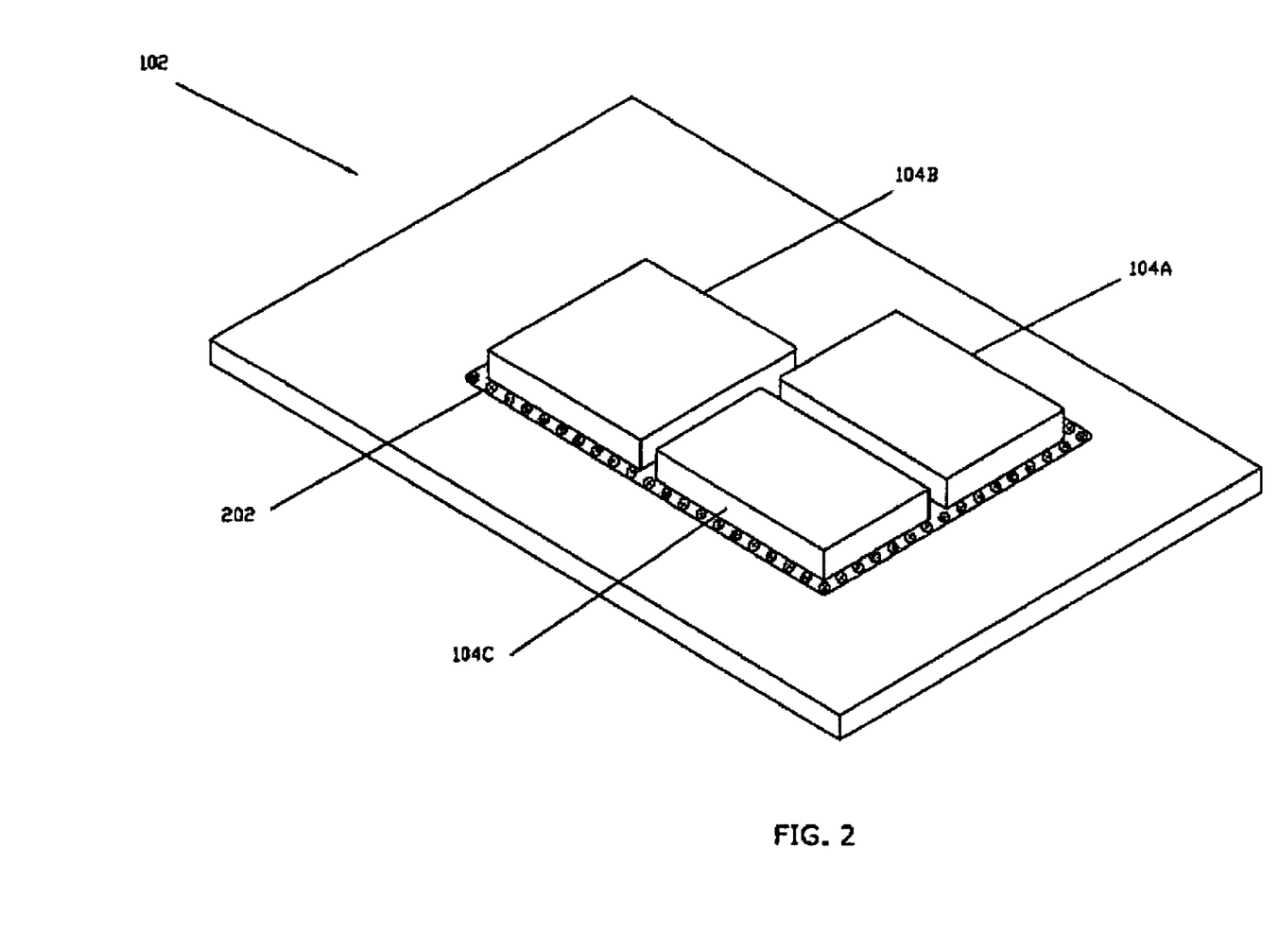
FIG. 2 represents a perspective view of a shielding apparatus attached to a printed circuit board, in accordance with an exemplary embodiment of the present invention.

Referring to FIG. 2, this figure is a perspective view of the shielding apparatus 104 attached to the printed circuit board 102 in accordance with an exemplary embodiment of the present invention. In the disclosed embodiment, the shielding apparatus 104 is attached to the printed circuit board 102 by using a mechanical means such as screwing, clipping, applying heat pins, and applying sonic welded pins. An example of a mechanical attachment is shown by 202.

In another embodiment, the shielding apparatus can also be attached to the printed circuit board by other chemical means such as bonding with a metal solder or with an adhesive which may be electrically conductive, or a double sided tape. Depending upon the requirements of the application, an interface layer may be provided to extend continuously or discontinuously between all or a portion of the interfacing surfaces, and additionally may provide an environmental seal there between. The interface layer may be the solder or adhesive which may be used to bond the shield to the printed circuit board, or the layer may be another coating such as a metal or a metal-filled paint which may be applied to one or both of the interfacing surfaces, such as by flame or arc-wire spraying, dipping, painting, screen or transfer printing, dispensing, extrusion, cladding, metallizing, laminating, electro-less or electrolytic plating, vacuum or chemical vapor deposition, evaporation, sputtering, plasma coating, or the like.

Figure 3:
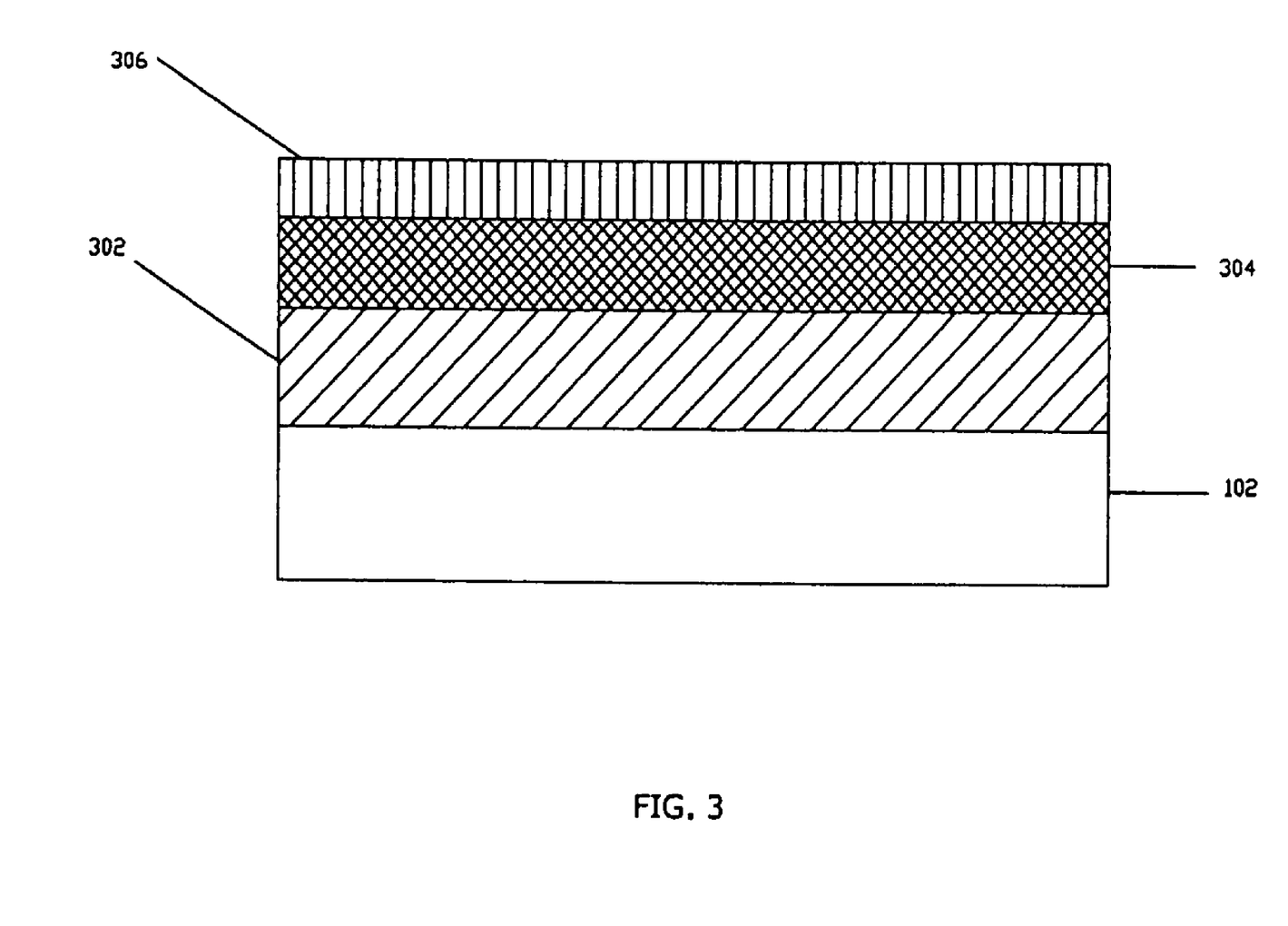
FIG. 3 represents a sectional view of a shielding apparatus attached to a printed circuit board, in accordance with an exemplary embodiment of the present invention.

FIG. 3 represents a sectional view of a shielding apparatus attached to the printed circuit board 102, in accordance with an exemplary embodiment of the present invention. The shielding apparatus 104 includes a plastic part 302, a metal conformal coating 304 and a form-in-place electromagnetic interference gasket 306. The plastic part 302 is configured to be placed over the printed circuit board 102. The plastic part 302 has a substantially thin cross-section and an interior surface that follows closely the surface of the component 106, therefore minimizing the volume enclosed. The plastic part 302 is configured as one or more compartments to provide an enclosure for the shielding apparatus 104.

In an embodiment of the present invention, the plastic part 302 is made of a thermoplastic polymer. The polymeric component, which itself may be a blend or other admixture, may be a thermoplastic or thermoset, and specifically may be selected depending upon one or more of the following parameters: operating temperature, hardness, chemical compatibility, resiliency, compliancy, compression-deflection, compression set, flexibility, ability to recover after deformation, modulus, tensile strength, elongation, force defection, flammability, or other chemical or physical properties. Depending upon the application, suitable materials may include, particularly, polyurethanes, silicones, fluorosilicones, polycarbonates, ethylene vinyl acetates (EVA), acrylonitrile-butadiene-styrenes (ABS), polysulfones, acrylics, polyvinyl chlorides (PVC), polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes (SIS), styrene-butadiene-styrenes (SBS), ethylene-propylenes (EPR), ethylene-propylene-diene monomers (EPDM), nitrile-butadienes (NBR), and styrene-butadienes (SBR), and copolymers and blends thereof. Any of the forgoing materials may be used unfoamed or, if required by the application, blown or otherwise chemically or physically processed into open or closed cell foams.

The polymeric component generally may form a binder or other continuous or matrix phase within the material into which the electrically-conductive particulate filler may be dispersed as a discrete phase. The filler generally is included within the binder in a proportion sufficient to provide the level of electrical conductivity which is desired for the intended application.

The thermoplastic polymer can be dispersed either with an electrically conductive fiber or electrically conductive powder for providing the desired shielding properties. In an embodiment of the present invention, the electrical conductive filler can be added between about 1% and about 50% by weight depending on the overall specification. The weight ratio can be varied to obtain desired and specific properties. It should be appreciated that the identification and selection of the proper combination of the material properties is important in achieving the desired performance properties. The overall structure avoids risks of electrical shock and completely envelopes the regions to provide a desired shielding effectiveness. Examples of the thermoplastic polymer include, but are not limited to, PC/ABS alloys, PBT, nylon, PC, ABS, and mixtures thereof. Examples of the electrical conductive filler include, but are not limited to, nickel plated carbon fiber, carbon fiber, carbon powder, silver powder, copper powder, Ag/Cu powder, Ag/Al powder, Ag plated glass spheres, and nickel powder.

The metal conformal coating 304 is applied uniformly and continuously to various plastic parts. The thickness of the metal conformal coating 304 should be sufficient to prevent the passage of the electromagnetic radiation generated by the coated printed circuit board. In an embodiment of the present invention, the metal conformal coating 304 is applied at a film thickness of about 0.0001 inches to about 0.005 inches. The metal composition used for coating includes but is not limited to Sn, Ag, Ni, Cu, or any combination thereof.

It should be understood, however, that in alternative embodiments, a metal conformal coating has a thickness that depends on its ohmic resistance and desired shielding effectiveness at the anticipated electromagnetic frequencies to be shielded. Various metal conformal coating processes are known to a person of ordinary skill in the art. Examples of the metal coating processes include, but are not limited to, thermal spray, vacuum deposition, electro-less plating, and electroplating techniques.

The form-in-place electromagnetic interference gasket 306 is coupled to the printed circuit board 102 for providing shielding effectiveness. In an embodiment of the present invention, the form-in-place electromagnetic interference gasket 306 is applied on top of the metal coating in an area of a part flange.

In an embodiment of the present invention, the form-in-place electromagnetic interference gasket 306 is made of an elastomeric polymer into which electrical conductive filler is dispersed for providing conductivity. Examples of the elastomeric polymer include, but are not limited to, silicone, urethane, and flexible epoxy. In this regard, such polymeric material may be provided in the form of a gasket having a resilient core element affording gap-filling capabilities, which core element may be loaded, sheathed, or coated with an electrically conductive element. The resilient core element, which may be foamed or unfoamed, solid or tubular, typically may be molded, extruded, die-cut, or otherwise formed of an elastomeric thermoplastic material such as a polyolefin, polyvinyl chloride, a polypropylene-EPDM blend, or a thermoplastic or thermosetting rubber such as a butadiene, styrene-butadiene, nitrile, chlorosulfonate, neoprene, urethane, silicone, or fluorosilicone.

The electrically conductive materials for the filler, sheathing, or coating include metal or metal-plated particles, fabrics, meshes, and fibers. The electrically conductive filler dispersed in the elastomeric gasket include, but are not limited to, nickel plated carbon fiber, carbon fiber, carbon powder, silver powder, copper powder, Ag/Cu powder, Ag/Al powder, Ag plated glass spheres, nickel powder or any combination of these fillers. Other conductive particles and fibers such as carbon, graphite, plated glass, or a conductive polymer material may be substituted.

The gasket, alternatively, may be provided as an all-metal, knitted wire construction, or as an over-molded or formed-in-place (FIP) bead of a curable, electrically-conductive silicone or urethane composition. As to an FIP construction, the composition may be dispensed in a fluent state onto one or the other of the surfaces, and then cured or foamed in situ via the application of heat or with atmospheric moisture, UV, radiation, or other energy sources.

In an embodiment of the present invention, the form-in-place electromagnetic interference gasket 306 can have a plurality of cross sectional shapes. Examples of the cross sectional shapes include, but are not limited to, a "D" shape, an "O" shape, an "L" shape, a "triangular" shape, and a stacked "O" shape. The multiple cross sectional shapes provide flexibility and the material can be formed into virtually any shape. The material can incorporate multiple cavities and accommodate intricately shaped components and devices.

The shielding performance of a gasket can be affected by a number of factors including compression set, corrosion, force deflection, mating flange tolerance, and environmental forces. Different types of gaskets are available such as conductive jacket over-coat gaskets, all metal gaskets, elastomeric gaskets, mixed media gaskets, etc. Depending on the particular requirements, designers use different gaskets as required. For example, for wireless devices, elastomeric gaskets are preferred over other types as these gaskets are in the form of plastic inter-board frames over-molded with soft conductive material. Conductive fabric over foam gaskets are widely used for stand alone desktops or portable PCs, multimedia devices and low end servers and data switches. UL94-VO rated gaskets are needed when high level shielding is required, for example in large and mid sized servers, data storage systems, and large office central switching systems.

Figure 4:
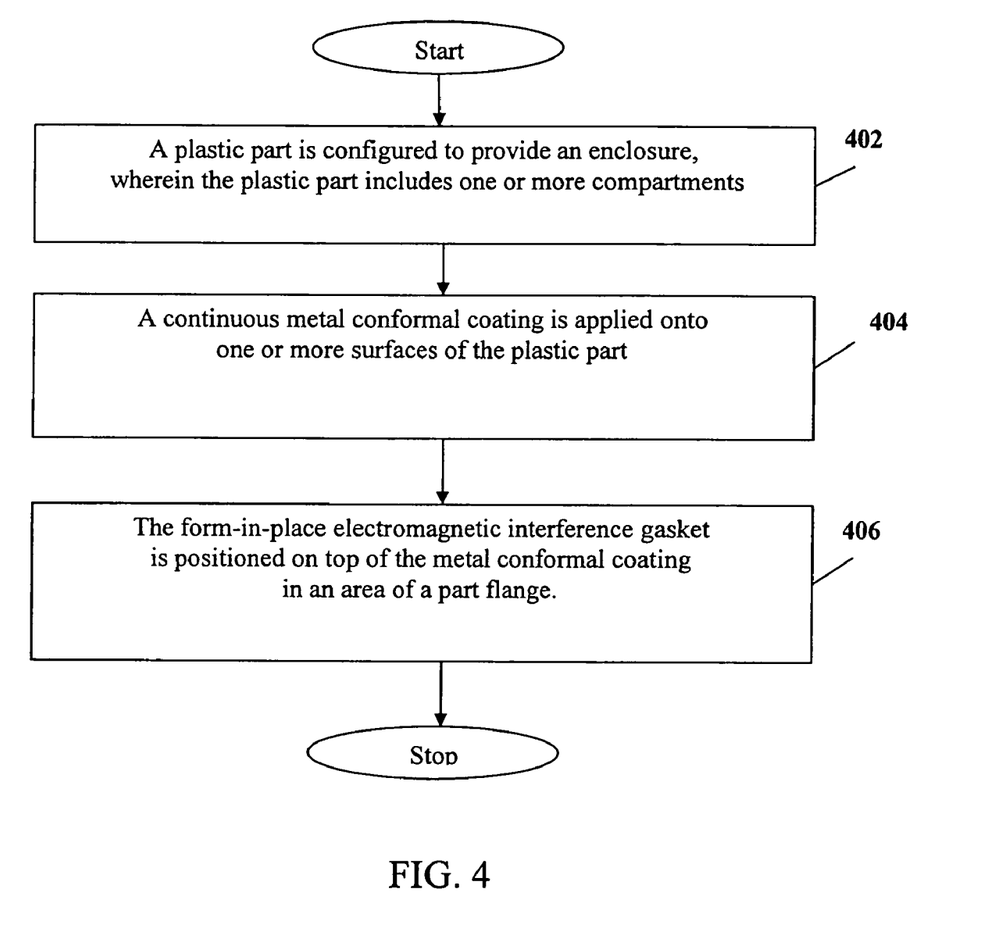
FIG. 4 illustrates a flowchart depicting a method for assembling a shielding apparatus in accordance with an exemplary embodiment of the present invention.

FIG. 4 representatively illustrates a flowchart depicting a method for assembling a shielding apparatus for shielding electromagnetic interference, in accordance with an exemplary embodiment of the present invention. At step 402, the plastic part 302 is configured to provide an enclosure. The plastic part 302 includes one or more compartments. The plastic part 302 has a substantially thin cross-section and an interior surface that follows closely the surface of the component 106, therefore minimizing the volume enclosed. At step 404, the continuous metal conformal coating 304 is applied onto one or more surfaces of the plastic part 302. The continuous metal conformal coating 304 can generate a faraday cage by grounding the perimeter of the printed circuit board 102. A potential can be developed between regions of a shielding apparatus that coat the top surface, and the regions of the shielding apparatus that coat the bottom surface. At step 406, the form-in-place electromagnetic interference gasket 306 is positioned on top of the metal conformal coating 304 in an area of a part flange.

Various embodiments of the electromagnetic shielding apparatus of the present invention offer many advantages. The apparatus can be deployed to provide thermal management or Electromagnetic Interference (EMI)/Radio frequency Interference (RFI) shielding for multiple circuitries. The apparatus provides easy installation, is available in flexible shapes for adjustment in multiple cavities, and can be easily soldered in multiple ways onto circuitries to provide effective shielding.

Various other embodiments are possible and are within the spirit and scope of the invention and the aforementioned embodiments. The particular embodiments described herein are meant to be for explanatory purposes only, and are not intended to restrict the invention in any manner. The articles of the invention may be made from various kinds of materials available in the field and known to a person skilled in the art. The invention intends to cover all the equivalent embodiments and is limited only by the appended claims.

What is claimed is:

1. An apparatus for shielding electromagnetic interference in a printed circuit board, said apparatus comprising:
   a plastic part having one or more compartments providing an enclosure, said plastic part having at least first and second opposed surfaces, the first surface being attached to the printed circuit board;
   a continuous metal conformal coating applied onto at least the second surface of said plastic part, said metal conformal coating having a thickness of from about 0.0001 inches to about 0.005 inches; and
   a form-in-place electromagnetic interference gasket applied to the top surface of said metal conformal coating covering the plastic part in an area of a part flange.

2. The apparatus as claimed in claim 1, wherein the form-in-place electromagnetic interference gasket has a cross sectional shape selected from the group consisting of a "D" shape, an "O" shape, an "L" shape, a "triangular" shape, and a stacked "O" shape.

3. The apparatus as claimed in claim 1, wherein the metal used for coating is selected from the group comprising Sn, Ag, Ni, Cu, and any combination thereof.

4. The apparatus as claimed in claim 1, wherein the plastic part is attached to the printed circuit board by using a mechanical means selected from the group consisting of screwing, clipping, applying heat pins, and applying sonic welded pins.

5. The apparatus as claimed in claim 1, wherein the plastic part is made of a thermoplastic polymer.

6. The apparatus as claimed in claim 5, wherein the thermoplastic polymer is selected from the group consisting of PC/ABS alloys, PBT, nylon, PC, ABS, and mixtures thereof.

7. The apparatus as claimed in claim 5, wherein the thermoplastic polymer is further dispersed with an electrically conductive filler.

8. The apparatus as claimed in claim 7, wherein the electrical conductive filler is selected from the group consisting of nickel plated carbon filler, and carbon filler.

9. The apparatus as claimed in claim 7, wherein the electrically conductive filler is added in an amount between about 1% and about 50% by weight.

10. The apparatus as claimed in claim 5, wherein the thermoplastic polymer is further dispersed with an electrically conductive powder.

11. The apparatus as claimed in claim 10, wherein the electrically conductive powder is selected from a group consisting of carbon powder, silver powder, copper powder, Ag/Cu powder, Ag/Al powder, Ag plated glass spheres, and nickel powder.

12. The apparatus as claimed in claim 10, wherein the electrical conductive powder is added in an amount between about 1% and about 50% by weight.

13. The apparatus as claimed in claim 1, wherein the form-in-place electromagnetic interference gasket is an elastomeric polymer dispersed with an electrically conductive filler.

14. The apparatus as claimed in claim 13, wherein the elastomeric polymer is selected from the group consisting of silicone, urethane, and flexible epoxy.

15. The apparatus as claimed in claim 13, wherein the electrically conductive filler is selected from the group consisting of nickel plated carbon filler, carbon filler, carbon powder, silver powder, copper powder, Ag/Cu powder, Ag/Al powder, Ag plated glass spheres, nickel powder, and any combination thereof.

16. A method of making an apparatus for shielding electromagnetic interference in a printed circuit board, said method comprising the steps of:
configuring a plastic part to provide an enclosure, said plastic part having one or more compartments, said plastic part having at least first and second opposed surfaces, the first surface being attached to the printed circuit board;
applying a continuous metal conformal coating onto at least the second surface of the plastic part, said continuous metal conformal coating having a thickness of about 0.0001 inches to about 0.005 inches; and
positioning a form-in-place electromagnetic interference gasket on the top surface of the metal conformal coating covering the plastic part in an area of a part flange.

17. The method as claimed in claim 16 further comprising attaching the plastic part to the printed circuit board by using a mechanical means selected from the group consisting of screwing, clipping, applying heat pins, and applying sonic welded pins.

18. The method as claimed in claim 16, wherein applying the metal conformal coating is selected from the group consisting of thermal spray, vacuum deposition, electroless plating, and an electroplating technique.

19. The method as claimed in claim 16, wherein the metal used for coating is selected from the group consisting of Sn, Ag, Ni, Cu or any combination thereof.

20. The method as claimed in claim 16, wherein the plastic part is made of a thermoplastic polymer.

21. The method as claimed in claim 20, wherein the thermoplastic polymer is selected from the group consisting of PC/ABS alloys, PBT, nylon, PC, ABS, and mixtures thereof.

22. The method as claimed in claim 20, wherein the thermoplastic polymer is further dispersed with an electrically conductive filler.

23. The method as claimed in claim 22, wherein the electrically conductive filler is selected from the group consisting of nickel plated carbon filler, and carbon filler.

24. The method as claimed in claim 22, wherein the electrical conductive filler is added in amount of between about 1% and about 50% by weight.

25. The method as claimed in claim 20, wherein the thermoplastic polymer is further dispersed with an electrically conductive powder.

26. The method as claimed in claim 25, wherein the electrical conductive powder is selected from a group consisting of carbon powder, silver powder, copper powder, Ag/Cu powder, Ag/Al powder, Ag plated glass spheres, and nickel powder.

27. The method as claimed in claim 25, wherein the electrically conductive powder is added in an amount between about 1% and about 50% by weight.

28. The method as claimed in claim 16, wherein the form-in-place electromagnetic interference gasket is an elastomeric polymer filled with an electrically conductive filler.

29. The method as claimed in claim 28, wherein the elastomeric polymer is selected from the group consisting of silicone, urethane, and flexible epoxy.

30. The method as claimed in claim 28, wherein the electrical conductive filler is selected from the group consisting of nickel plated carbon filler, carbon filler, carbon powder, silver powder, copper powder, Ag/Cu powder, Ag/Al powder, Ag plated glass spheres, nickel powder, and any combination thereof.

31. The method as claimed in claim 16, wherein the form-in-place electromagnetic interference gasket has a cross sectional shape selected from the group consisting of a "D" shape, an "O" shape, an "L" shape, a "triangular" shape, and a stacked "O" shape.

* * * * *

UNITED STATES PATENT AND TRADEMARK OFFICE
CERTIFICATE OF CORRECTION

PATENT NO.        : 7,446,265 B2                                        Page 1 of 1
APPLICATION NO. : 11/404704
DATED             : November 4, 2008
INVENTOR(S)       : John C. Ariel et al.

It is certified that error appears in the above-identified patent and that said Letters Patent is hereby corrected as shown below:

On the Title Page Item (75)
Change the name of the inventor "Marc E. LaRosse" to: Marc E. LaRosee Signed and Sealed this Twenty-third Day of December, 2008

JON W. DUDAS
*Director of the United States Patent and Trademark Office*